(12) United States Patent
Wakabayashi

(10) Patent No.: US 8,021,513 B2
(45) Date of Patent: Sep. 20, 2011

(54) SUBSTRATE CARRYING APPARATUS AND SUBSTRATE CARRYING METHOD

(75) Inventor: Shinji Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1063 days.

(21) Appl. No.: 11/892,430

(22) Filed: Aug. 22, 2007

(65) Prior Publication Data
US 2008/0050924 A1 Feb. 28, 2008

Related U.S. Application Data

(60) Provisional application No. 60/844,673, filed on Sep. 15, 2006.

(30) Foreign Application Priority Data

Aug. 23, 2006 (JP) .................. 2006-225973

(51) Int. Cl.
H01L 21/306 (2006.01)
(52) U.S. Cl. ......... 156/345.24; 156/345.29; 156/345.51; 156/345.54; 156/345.55

(58) Field of Classification Search ............. 156/345.24, 156/345.29, 345.51, 345.54, 345.55
See application file for complete search history.

(56) References Cited

U.S. PATENT DOCUMENTS

| | | | |
|---|---|---|---|
| 2004/0105738 A1* | 6/2004 | Ahn et al. | 414/222.01 |
| 2005/0059254 A1* | 3/2005 | Shi et al. | 438/709 |
| 2006/0177289 A1* | 8/2006 | Bonora et al. | 414/217 |
| 2007/0066204 A1* | 3/2007 | Tanimura et al. | 454/65 |
| 2007/0068628 A1* | 3/2007 | Uchino et al. | 156/345.32 |

* cited by examiner

*Primary Examiner* — Binh X Tran
(74) *Attorney, Agent, or Firm* — Smith, Gambrell & Russell, LLP

(57) ABSTRACT

A substrate processing apparatus, adapted to provide a process, such as etching, to a substrate, includes a processing vessel, an ambient atmospheric carrying chamber, a carrying member for carrying the substrate, and a functional module located on a carrying route of the substrate. A first air stream is provided in the ambient atmospheric carrying chamber, and a second air stream is provided in the functional module so as to create a stream of air directed toward the ambient atmospheric carrying chamber from the functional module so as to prevent by-products of the process provided to the substrate from entering the functional module.

6 Claims, 7 Drawing Sheets

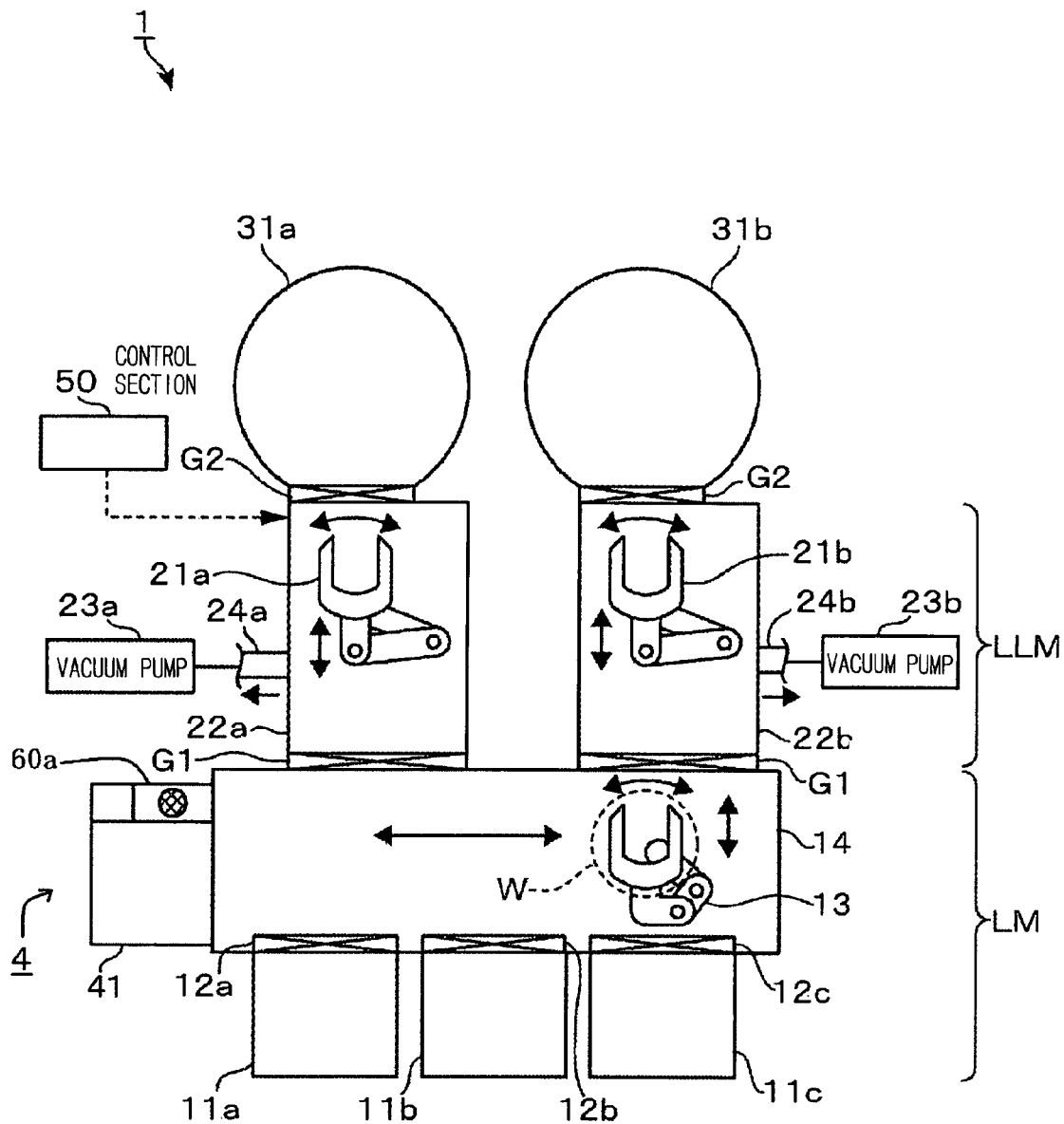
F I G. 1

SUBSTRATE CARRYING APPARATUS AND SUBSTRATE CARRYING METHOD

CROSS REFERENCE TO PRIOR APPLICATIONS

This application claims priority from U.S. Provisional Application No. 60/844,673 filed on Sep. 15, 2006, and Japanese Patent Application No. 2006-225973 filed on Aug. 23, 2006. The entire contents of these applications are incorporated herein by reference.

BACKGROUND OF THE INVENTION

1. Field of the Invention

The present invention relates to a technique for creating an air stream between a functional module adapted to perform substrate positioning and/or testing after treatments and an ambient atmospheric carrying chamber, in a substrate processing apparatus including, for example, a vacuum processing vessel for providing a vacuum process to a substrate, for example, a semiconductor wafer and the ambient atmospheric carrying chamber adapted to carry the substrate in an ambient atmosphere.

2. Background Art

Among semiconductor manufacturing apparatuses, there is an apparatus for providing an etching process and/or film forming process to each substrate, such as a semiconductor wafer (hereinafter, referred to as a wafer) or a glass substrate for use in a flat panel, in a vacuum atmosphere. As such an apparatus, the so-called multi-chamber system is known, which includes a carrier port for placing a carrier thereon, a substrate carrying chamber, and a plurality of vacuum chambers each connected with the substrate carrying chamber.

To this system, various improvements have been added, taking into account enhancement of the throughput, downsizing and/or cost reduction, and, for example, apparatuses each including an ambient atmospheric carrying chamber connected with the carrier port and load lock chambers respectively provided between the ambient atmospheric chamber and the plurality of vacuum chambers (processing vessels) or apparatuses each including load lock chambers provided between a vacuum carrying chamber to which the plurality of the vacuum chambers are connected and the ambient atmospheric carrying chamber have been employed.

Generally, in an atmosphere in which substrates are placed and/or carried under ambient conditions, a fan filter unit (hereinafter, referred to as an FFU) is provided at a ceiling portion, from which cleaned air is fed to create a down flow, whereby particles to be generated from mechanical parts can be discharged so as to keep a cleaned atmosphere. For example, also in the ambient atmospheric carrying chamber, the FFU is provided at a ceiling portion and a discharging unit is provided at a bottom face in order to create a down flow with cleaned air.

Moreover, in the multi-chamber system, in order to place a substrate in each vacuum chamber, in a preset position and a predetermined orientation, it is necessary to provide an alignment module (orienter), which is a functional module adapted to determine an orientation and a central position of a substrate, for example, a wafer. For example, a configuration including such an orienter connected to the ambient atmospheric carrying chamber is currently employed.

The orienter is configured to include a rotary stage for placing a substrate thereon and a detecting means, for example a transmission-type sensor, for detecting the periphery of the substrate, both being provided in a housing. Also in this housing, an air stream of cleaned air is created by bringing in cleaned air of the ambient atmospheric carrying chamber from a transfer port, due to an intake effect by a fan, in order to discharge particles.

In each vacuum chamber connected to such a system, as in the case wherein a processing gas, such as an HBr gas or HCl gas, is introduced into the chamber and then changed into plasma so as to etch a polysilicon film formed on each wafer, by-products (silicon bromide, silicon chloride or the like) associated with such an etching process may tend to be attached to the wafer surface.

It has been found that upon carrying out such a wafer from each vacuum chamber, corrosive gases, such as hydrogen bromide, hydrogen chloride or the like, for example, may tend to be generated by reaction of silicon bromide, silicon chloride or the like as described above, with moisture in the atmosphere, and the corrosive gases may further tend to be reacted with ammonia existing in a trace amount in the atmosphere, so as to be changed into particles of ammonium bromide, ammonium chloride or the like and diffused in the carrying chamber.

As a result, the corrosive gases and particles diffused in the carrying chamber will also flow into the housing of the orienter, together with the cleaned air to be taken in from the ambient atmospheric carrying chamber. In the case where the corrosive gases flow into the housing, they will corrode metallic portions of the orienter. Alternatively, in the case where the particles flow into the housing, they will attach to the orienter. In particular, in the case where the particles attach to an optical system, light receiving signals are likely to be badly affected, thus making it difficult to detect accurate positions of the wafer periphery.

Patent Document (TOKUKAI No. 2004-281474, KOHO, Paragraph 0024, FIG. 1 and FIG. 2) describes a system including the FFU provided at a ceiling portion of the carrying apparatus for carrying wafers between respective devices during a semiconductor manufacturing process. However, this reference does not refer to the above issue.

SUMMARY OF THE INVENTION

The present invention was made under the circumstances described above, and therefore it is an object of this invention to provide a substrate processing apparatus and a substrate processing method, which employs a processing vessel for providing a process to a substrate, an ambient atmospheric carrying chamber, and a functional module located on a carrying route of each wafer to be carried by a carrying means in the ambient atmospheric carrying chamber, wherein the apparatus and method are configured such that the functional module is not adversely affected by particles and/or corrosive gases to be generated due to contact of each processed substrate with the ambient atmosphere.

A substrate processing apparatus related to the present invention comprises:

a processing vessel adapted to provide a process to a substrate;

an ambient atmospheric carrying chamber which is connected airtightly with the processing vessel, includes a carrying means adapted to receive and carry the substrate having been processed in the processing vessel, and is set under an ambient atmosphere;

a first air stream creating means for creating a stream of cleaned air in the ambient atmospheric carrying chamber;

a functional module provided in a position for enabling the substrate to be transferred by the carrying means, and adapted to provide a predetermined work to the substrate in the ambient atmosphere; and a second air stream creating means for creating a stream of cleaned air directed toward the interior of the ambient atmospheric carrying chamber, by taking in a gas from the exterior of the substrate processing apparatus toward the functional module, wherein in the processing vessel, the process for generating products on the substrate is performed to the substrate, the products having potential to be diffused into the ambient air, as particles and/or corrosive gases, due to contact with the ambient air.

It is preferred that the second air stream creating means is configured such that the interior of the functional module is set under a pressure condition which is more positive than in the ambient atmospheric carrying chamber.

It is preferred that the second air stream creating means is composed of a fan filter unit including a fan and a gas filter. Preferably, the work provided to the substrate by the functional module is an alignment for the substrate and/or a test for the substrate. More preferably, the work provided to the substrate by the functional module is carried out by using an optical instrument. The present invention is applicable to the case wherein the product generated by the process to be provided to the substrate in the processing vessel is a silicon halide.

The process to be provided to the substrate in the processing vessel may be a vacuum process, and a load lock chamber may be provided between the ambient atmospheric chamber and the processing vessel, wherein the load lock chamber can be changed between a normal pressure atmospheric operational mode and a vacuum atmospheric operational mode.

A method related to the present invention for providing a process to a substrate, by using a substrate processing apparatus, which includes an ambient atmospheric carrying chamber including a carrying means for carrying the substrate and set under an ambient atmosphere, and a processing vessel connected airtightly with the ambient atmospheric carrying chamber and adapted to provide a process to the substrate, comprises the steps of:

carrying out the process for generating products on the substrate in the processing vessel, the products having potential to be diffused into the ambient air, as particles and/or corrosive gases, due to contact with the ambient air;

creating a stream of cleaned air in the ambient atmospheric carrying chamber, by using a first air stream creating means;

carrying the substrate, which has been processed in the processing vessel, into the ambient atmospheric carrying chamber, by using the carrying means;

carrying the substrate, prior to or after being processed in the processing vessel, into a functional module from the ambient atmospheric carrying chamber, by using the carrying means, so as to provide a predetermined work to the substrate, in the ambient atmosphere, in the functional module; and creating a stream of cleaned air directed toward the interior of the ambient atmospheric carrying chamber, by taking in a gas from the exterior of the substrate processing apparatus toward the functional module, by using a second air stream creating means.

It is preferred that in the step of creating the air stream by using the second air stream creating means, the air stream is created such that the interior of the functional module is set under a pressure condition which is more positive than in the ambient atmospheric carrying chamber.

According to the present invention, since the air stream is created by taking in a gas from the exterior of the substrate processing apparatus, upon creating the air stream in the functional module, so as to make the air stream flow out toward the interior of the ambient atmospheric carrying chamber, without intake of the stream of cleaned air created in the ambient atmospheric carrying chamber, even though particles and/or corrosive gases are generated due to contact of the ambient air with the substrate having been processed in the processing vessel and carried into the ambient atmospheric carrying chamber, entering such generated matters into the functional module can be prevented. Therefore, corrosion of the functional module due to the corrosive gases can be avoided. In addition, since attachment of the particles to the functional module can be prevented, bad effect on, for example, an optical system, in the functional module can be avoided.

BRIEF DESCRIPTION OF THE DRAWINGS

FIG. 1 is a plan view showing one example of a substrate processing apparatus according to one embodiment of this invention.

DETAILED DESCRIPTION OF THE INVENTION

EXAMPLES

Figure 2:
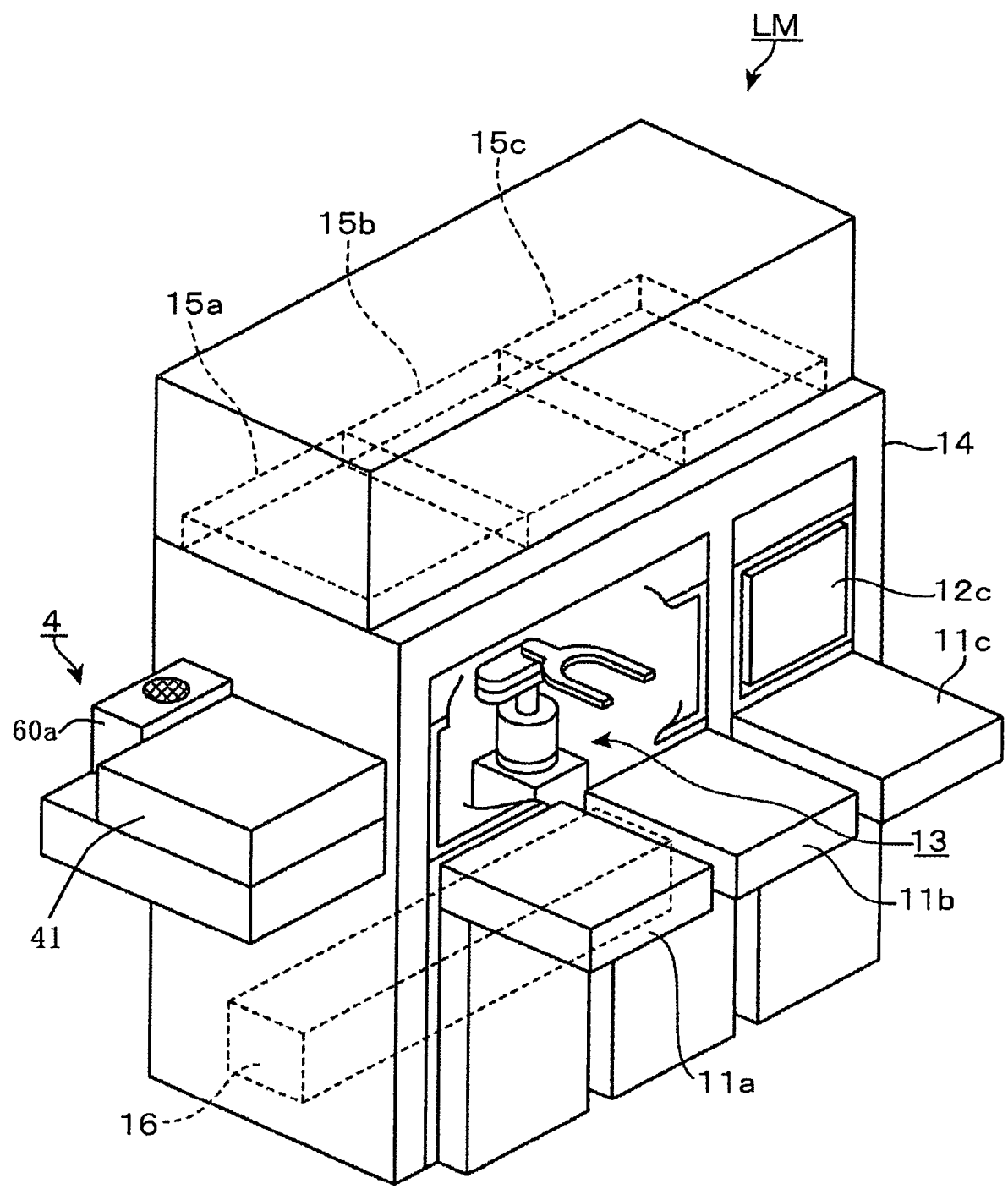
FIG. 2 is a perspective view showing a loader module (LM) of the substrate processing apparatus.

As one example of a substrate processing apparatus, a system in which the present invention is applied to a vacuum processing apparatus will be described with reference to FIGS. 1 to 4. FIG. 1 is a plan view showing one example of a substrate processing apparatus 1 according to one embodiment of this invention. Reference numeral 1 designates the substrate processing apparatus of a type called multi-chamber, which includes a first carrying means 13 and second carrying means 21a, 21b, constituting together a carrying system, processing vessels 31a, 31b each adapted to perform an etching process to each wafer W, and an orienter 4, which is a functional module adapted to determine and adjust the orientation and position of each wafer W carried into the substrate processing apparatus 1.

Figure 3:
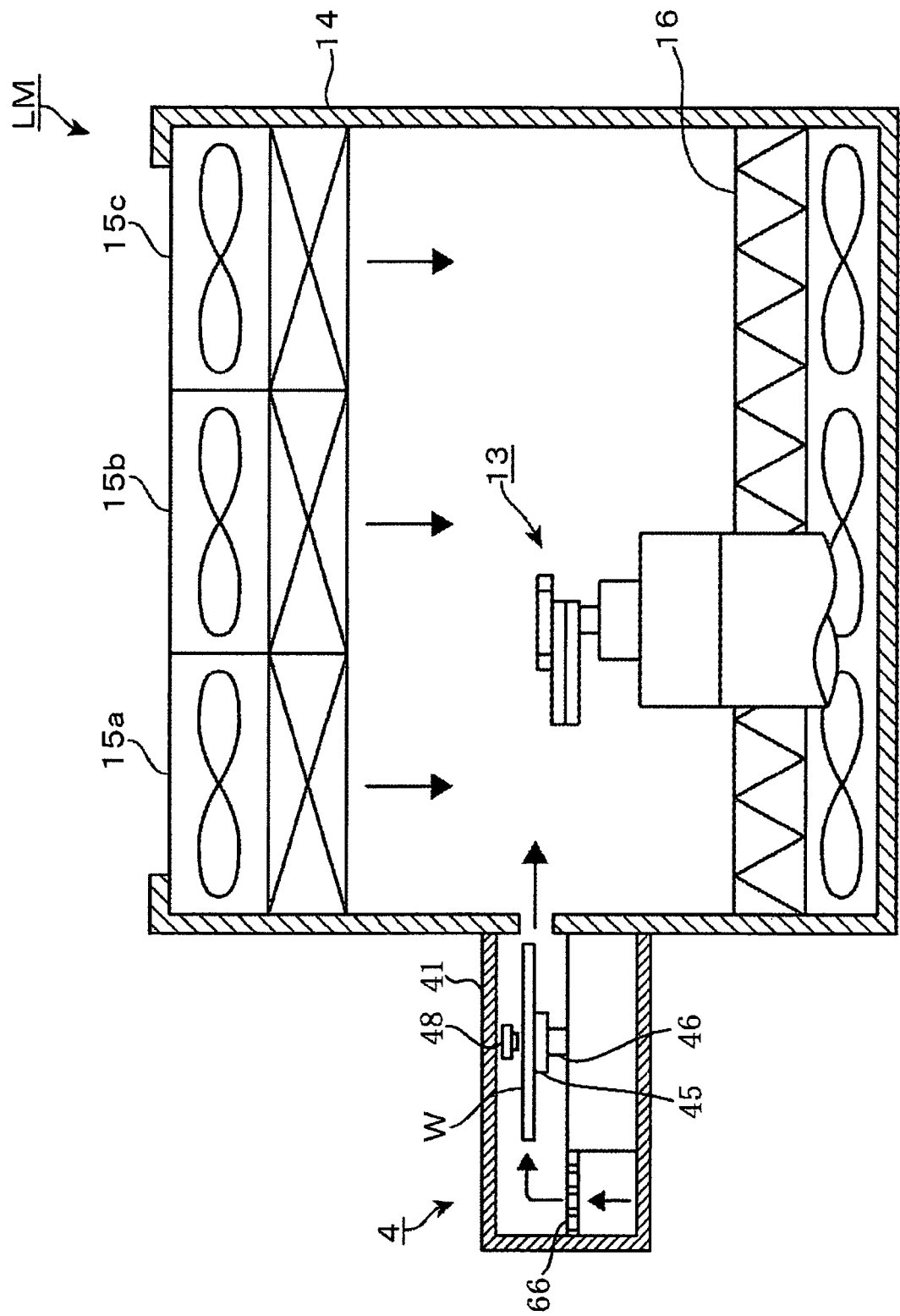
FIG. 3 is a longitudinal cross section of the LM.

As shown in a perspective view of FIG. 2 and a longitudinal cross section of FIG. 3, the first carrying means 13 is housed in an ambient atmospheric carrying chamber 14. To the front face of the ambient atmospheric carrying chamber 14, for example, three FOUP placing tables 11a to 11c each adapted to place thereon a front opening unified pod (FOUP or carrying container) also called wafer carrier, containing wafers W therein, and carrying doors 12a to 12c corresponding to the respective FOUP placing tables 11a to 11c, are attached. The carrying doors 12a to 12c are configured as FOUP openers, respectively, each adapted to remove a door provided at the front face of the corresponding FOUP. The first carrying means 13 is configured to transfer each wafer W, to and from, the FOUPs respectively placed on the FOUP placing tables 11a to 11c, orienter 4 and second carrying means 21a, 21b, through the ambient atmospheric carrying chamber 14. As shown in FIG. 1, the first carrying means 13 is configured to move a base for supporting a carrying arm in left and right directions, and is designed to rotate, extend and contract the carrying arm.

As shown in FIGS. 2 and 3, at a ceiling portion of the ambient atmospheric carrying chamber 14, for example, three first FFUs 15a to 15c are attached, which constitute together a first air stream creating means. The first FFUs 15a to 15c, as similar to a second FFU described below, are each composed of a fan unit containing a fan, including rotary blades and a motor in a housing, and a filter unit located on the discharging side of the fan unit and containing, for example, an ultra low penetration air (ULPA) filter, in a housing. At a bottom portion of the ambient atmospheric carrying chamber 14, an exhaust FFU 16 containing therein a chemical filter for removing an acidic gas is installed to be opposed to the first FFUs 15a to 15c. Thus, a down flow air stream of cleaned air can be created between the first FFUs 15a to 15c and the exhaust FFU 16, thereby making the interior of the ambient atmospheric carrying chamber 14 be a mini-environment which is filled with cleaned air.

As described above, a module apparatus, which serves to supply a wafer W to be processed and/or take out a processed wafer W, is generally called an equipment front end module (EFEM). The FOUP placing tables 11a to 11c for respectively supplying the wafer W are provided to the front face of the ambient atmospheric carrying chamber 14 including the FFUs 15a to 15c, and the carrying means 13 for the wafer W is provided in the ambient atmospheric carrying chamber 14.

Hereinafter, in the embodiment of this invention, the EFEM will be referred to as a loader module (LM).

Next, an load lock module (LLM) including the two carrying means 21a, 21b will be described. The substrate processing apparatus 1 may include, for example, two LLM, each comprising the second carrying means 21a, 21b each composed of a carrying arm, and load lock chambers 22a, 22b for respectively housing the second carrying means 21a, 21b therein. The second carrying means 21a, 21b serve to transfer wafers W between the first carrying means 13 and the processing vessels 31a, 31b, via the load lock chambers 22a, 22b, respectively.

Each load lock chamber 22a, 22b is connected with the ambient atmospheric carrying chamber 14 as well as with each processing vessels 31a, 31b, via gates G1, G2, respectively. The load lock chambers 22a, 22b are connected with vacuum pumps 23a, 23b, via exhaust pipes 24a, 24b, and include inlet ports for an inert gas, such as an $N_2$ gas, respectively. Thus, the pressure in each load lock chamber 22a, 22b can be changed between a predetermined vacuum atmosphere and a normal pressure atmosphere, with the gates G1, G2 being closed, respectively.

At least one of the processing vessels 31a, 31b respectively connected with the load lock chambers 22a, 22b is configured to perform an etching process to the wafer W carried therein. Now, the configuration to provide the etching process will be described with respect to the processing vessel 31a. In the processing vessel 31a, an upper electrode and a lower electrode (not shown) are disposed respectively, and an electrostatic chuck is provided at the lower electrode. In addition, a processing gas consisting of hydrogen halide, such as hydrogen bromide (HBr), is supplied into the processing vessel 31a from a processing gas source (not shown), and the processing gas is then changed into plasma by application of high-frequency power to the upper electrode or lower electrode. Thus, a reactive ion etching (RIE) apparatus, which can provide an etching process to a polysilicon film formed on the wafer W in this manner, is provided.

The other processing vessel 31b may be configured to provide the same etching process, as described above, to the wafer W, or otherwise may be configured as the RIE apparatus adapted to perform a different etching process, for example, a process for etching an $SiO_2$ film formed on the wafer W, by supplying, for example, carbon tetrafluoride as the processing gas and then changing it into plasma. The processing vessel 31b may also be configured, for example, as a CVD apparatus, for providing a predetermined film forming process onto the wafer W.

A high frequency power source connected to electrodes of each carrying means 13, 21a, 21b, vacuum pumps 23a, 23b and processing vessels 31a, 31b is controlled by a control section 50 for controlling the entire operation of the substrate processing apparatus 1. The control section 50 comprises, for example, a computer having a program storage portion (now shown). In the program storage portion, computer programs are stored, which include a group of steps (instructions) concerning operations for carrying each wafer W and processes to be performed in the processing vessels 31a, 31b. In this manner, the computer programs are read out by the control section 50, and the control section 50 then controls the operation of the substrate processing apparatus 1. The computer programs are stored in the program storage portion in a state wherein they are memorized in a memory means, for example, a hard disk, a compact disk, a magnet optical disk, a memory card and the like.

Figure 4:
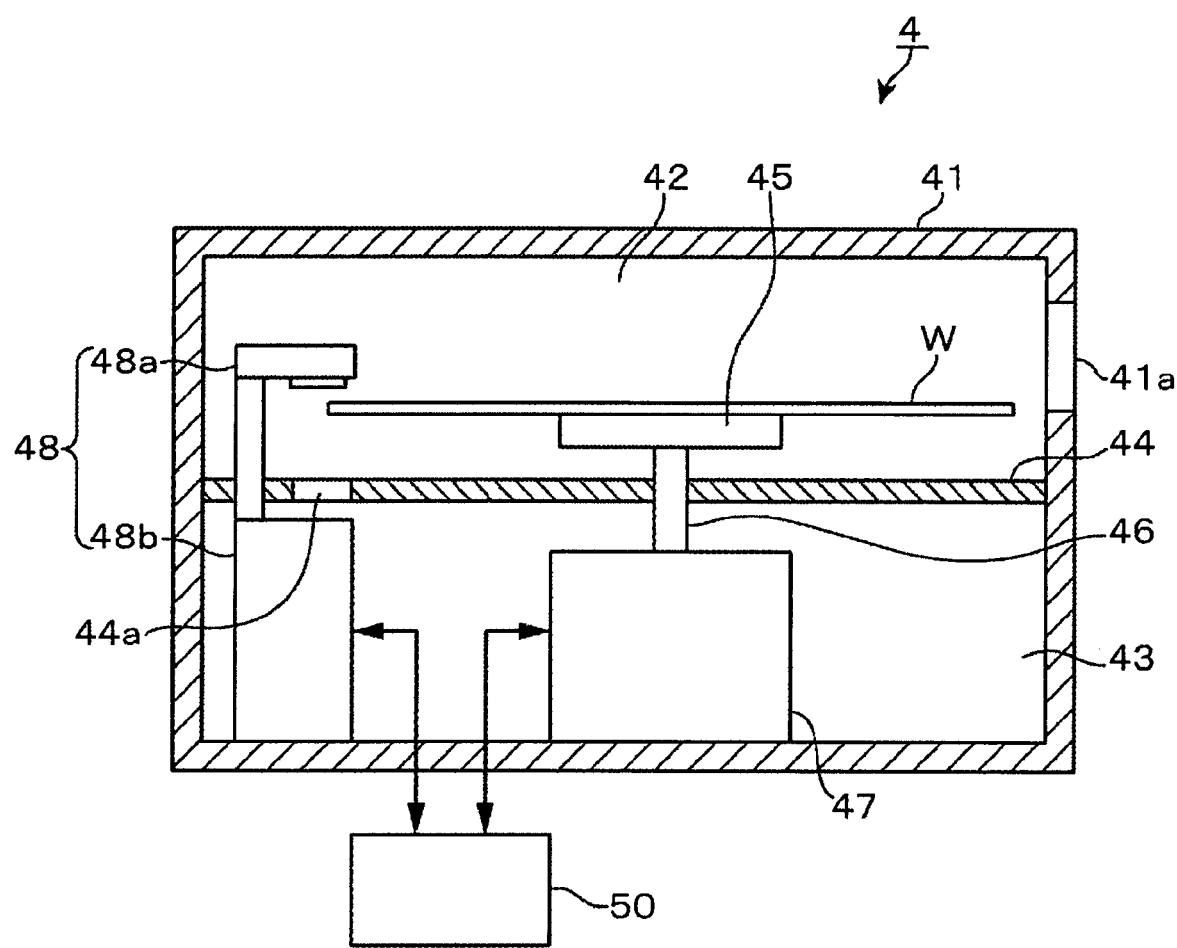
FIG. 4 is a longitudinal cross section showing a structure of an orienter, which is one example of a functional module.

Next, the orienter 4 related to the above embodiment will be described. The orienter 4 includes an orienter container 41 having a flat and generally box-like shape, and is attached to a side wall of the ambient atmospheric carrying chamber 14 of the LM, as shown in FIGS. 1 to 3. As shown in FIG. 4, the orienter container 41 is divided into an upper chamber 42 and a lower chamber 43 by a partition plate 44. In a side wall of on the side of the upper chamber 42 of the orienter container 41, a transfer port 41a is provided, which is used to carry in and carry out each wafer W relative to the ambient atmospheric carrying chamber 14 by using the first carrying means 13. In fact, while the transfer port 41a is provided in the side wall on the back side of the orienter container 41, it is expressed to be in the right side wall in FIG. 4 for convenience.

In the upper chamber 42, a placing table 45 is provided, which is used to place the wafer W thereon. The placing table 45 is connected, via a shaft 46, with a rotation drive mechanism 47 which is provided on the side of the lower chamber 43, such that the placing table 45 can be rotated about the vertical axis.

In the orienter container 41, a detection mechanism 48 is provided for detecting positions of the periphery of the wafer W placed on the placing table 45. The detection mechanism 48 is provided as a transmission-type sensor comprising, for example, a light emission section 48b formed of an LED or the like and located on the side of the lower chamber 43 and a light receiving section 48a formed of a CCD sensor or the like and located on the side of the upper chamber 42. The light emission section 48b and the light receiving section 48a are arranged vertically to be opposed to each other via a hole 44a formed in the partition plate 44. A part of light emitted from the light emission section 48b is blocked by the periphery of the wafer W placed on the placing table 45, and the remaining light will come into the light receiving section 48a.

The light receiving section 48a is designed to output a signal (detection data), indicative of an amount of the light which came therein, to the control section 50 previously described. Thereafter, the control section 50 drives the rotation drive mechanism 47 to make the wafer W rotate a round. Based on changes in the amount of light to be received by the light receiving section 48a during the operation, a position of a notch (or orientation flat) formed in the periphery of the wafer W is calculated, and a control operation for rotating the placing table 45 is carried out such that the notch of the wafer W is oriented toward a predetermined direction.

Moreover, the orienter 4 may include a mechanism (not shown) adapted to press the periphery of the wafer W toward the center of rotation of the placing table 45 in, for example, three directions, so as to align the central position of the wafer W. In addition, the orienter 4 may be configured to calculate the central position of the wafer W based on the detection data for the periphery of the wafer W and determine an amount of positional shift from the center of rotation of the placing table 45. In this case, for example, a receiving position of the wafer W on the first carrying means 13 may be corrected so as to place the wafer W on a predetermined position of the first carrying means 13.

In this embodiment, in order to prevent an air stream created in the ambient atmospheric carrying chamber 14 from flowing into the orienter container 41, a second air stream creating means is provided, which is adapted to create an air stream directed toward the LM from the orienter 4. Hereinafter, the details of the second air stream creating means will be described with reference to FIGS. 5 and 6.

Figure 5:
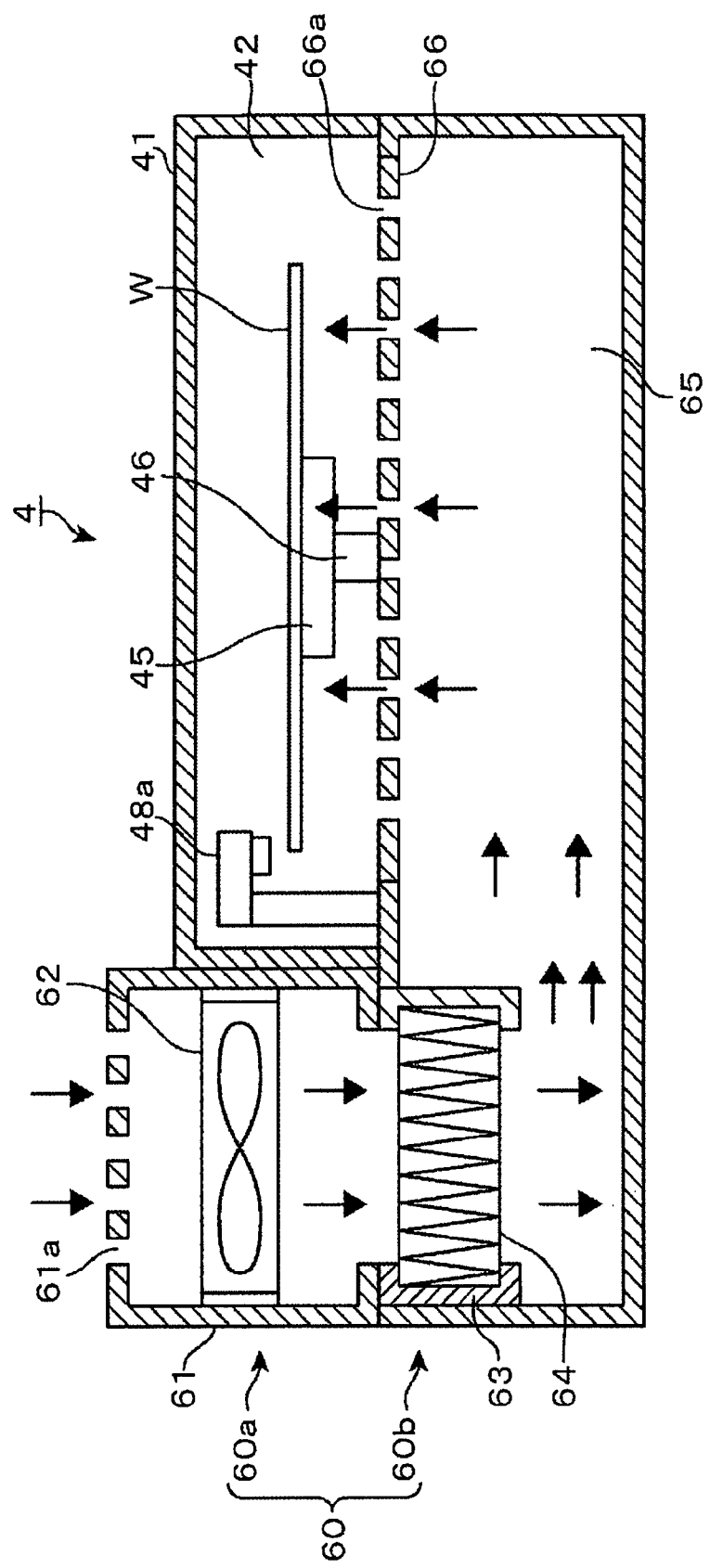
FIG. 5 is a longitudinal cross section showing one example of the orienter, which includes a fan filter unit as an air stream creating means.
Figure 6:
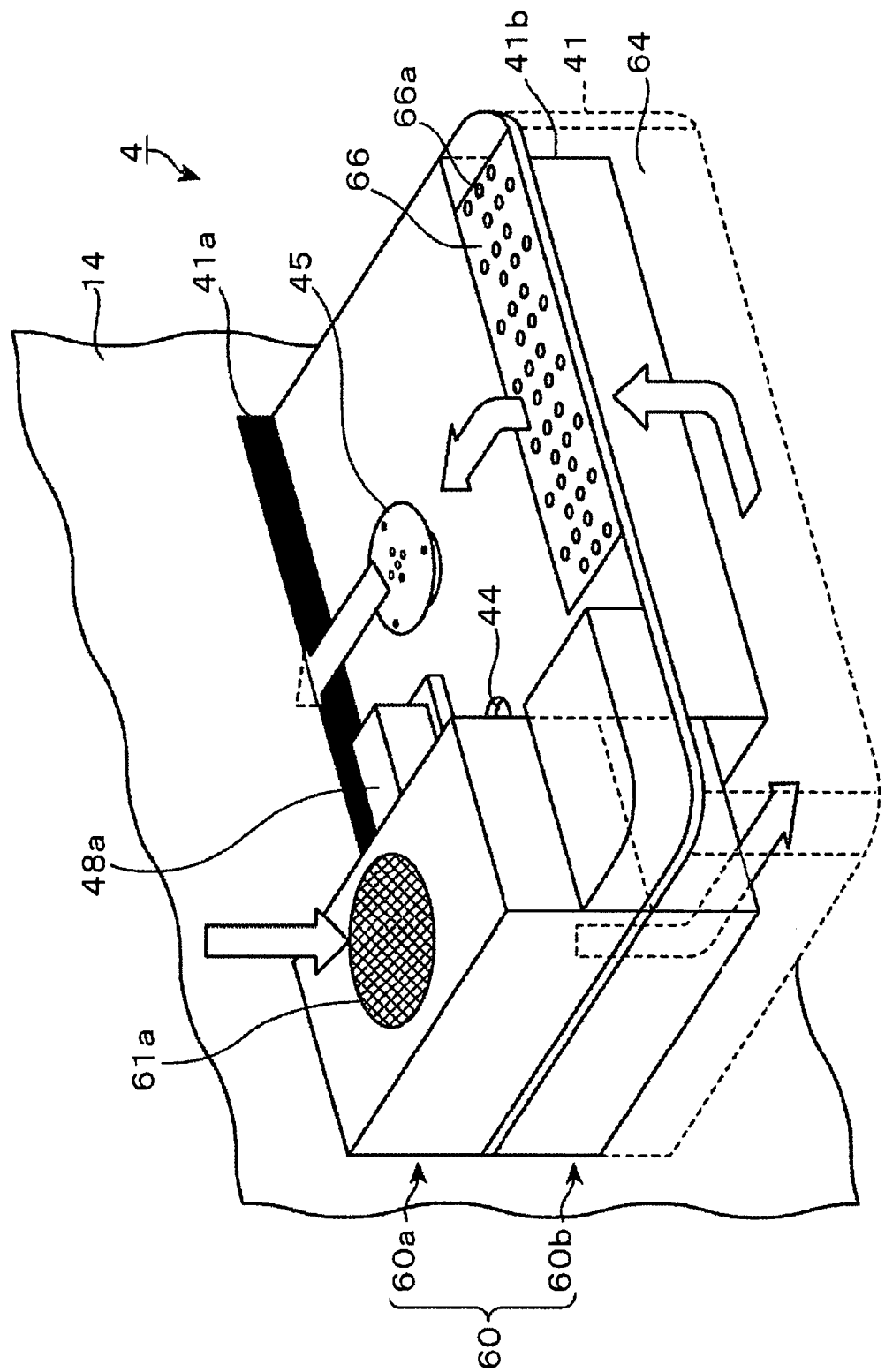
FIG. 6 is a perspective view of the orienter.

FIG. 5 is a cross section showing one example of the orienter 4, which includes the second air stream creating means, and FIG. 6 is a perspective view of the orienter 4. In order to create an air stream directed toward the LM, the orienter 4 includes a second FFU 60 as the second air stream creating means adapted to direct cleaned air into the upper chamber 42, and a duct 65 for connecting the second FFU 60 with the upper chamber 42.

The second FFU 60 is configured to include a fan unit 60a and a filter unit 60b. The fan unit 60a, as shown in FIG. 5, includes a housing 61, and a fan 62 contained in the housing 61. The fan 62 is composed of rotary blades and a motor (not shown), and serves to take in cleaned air from a clean room and direct it toward the upper chamber 42. In the housing 61, multiple intake holes 61a are formed on the intake side of the fan 62, for taking in the cleaned air, while the fan 62 is in communication with the filter unit 60b on the discharging side thereof.

The filter unit 60b includes a housing 63 and a ULPA filter 64 contained in the housing 63, and serves to filter the cleaned air supplied from the fan unit 60a so as to enhance cleanliness of the air. The ULPA filter 64 is contained in the housing 63 while its filtering material is folded in a bellows-like fashion. The housing 63 is configured to be in communication with the fan unit 60a on its flowing-in side of the cleaned air as well as with the duct 65 on its flowing-out side of the filtered air.

The duct 65, as shown in FIG. 5, is configured to make the cleaned air to be discharged from the filter unit 60b flow through a space defined between the orienter container 41 and an internal container 41b (not shown in FIG. 4) for housing the lower chamber 43 therein. A current plate 66 including through holes 66a for discharging the cleaned air is provided in a position substantially flush with the partition plate 44 shown in FIG. 4.

With the configuration described above, when the fan 62 of the fan unit 60a is operated, a stream of cleaned air is created as shown by arrows in FIGS. 5 and 6. In addition, by setting the output of the fan 62 such that the pressure in the upper chamber 42 becomes more positive relative to the pressure in the ambient atmospheric carrying chamber 14, as shown by arrows in FIG. 6, an air stream can be created to be directed from the upper chamber 42 toward the interior of the ambient atmospheric chamber 14 of the LM, as such making the interior of the upper chamber 42 be a mini-environment which is filled with cleaned air.

Next, operation of the substrate processing apparatus 1 related to the above embodiment will be described. Now, a case in which an etching process is performed to a polysilicon film, which has been formed on the wafer W, by using the processing vessel 31a, will be discussed.

First, when the FOUP, which is a carrying container for wafers W, is placed, for example, on the most left side FOUP placing table in FIG. 1, the door of the FOUP is removed by using the carrying door 12a. Subsequently, the first carrying means 13 takes out one sheet of wafer W from the FOUP, carries it into the upper chamber 42 of the orienter 4, and places it on the placing table 45. Due to the function of the orienter 4 as previously described, the orientation of the wafer W is adjusted while the positional error of, for example, the center of the wafer W, is detected.

Next, the first carrying means 13 takes out the wafer W from the upper chamber 42 of the orienter 4, and transfer it to the second carrying means 21a in the load lock chamber 22a. When the wafer W is transferred to the second carrying means 21a, the gate G1 on the side of the LM is closed, and the vacuum pump 23a is then operated to generate vacuum in the load lock chamber 22a. After a predetermined level of vacuum can be achieved in the load lock chamber 22a, the gate G2 on the side of the processing vessel 31a is opened, and the wafer W is then carried into the processing vessel 31a and placed on a placing table (not shown).

Thereafter, the gate G2 on the side of the processing vessel 31a is closed, the processing gas (e.g., HBr and/or carrier gas) is supplied into the processing vessel 31a while maintaining the degree of vacuum at a predetermined level. Thus, the processing gas is changed into plasma by application of high frequency power thereto so as to etch the polysilicon film on the surface of the wafer W. In this etching process, the silicon film is etched, due to generation of gaseous silicon bromide ($SiBr_4$) to be produced by a reaction between Br radicals generated by the plasma formation and Si contained in the polysilicon film. In this case, it is has been found that while the produced silicon bromide is discharged to the outside of the processing vessel 31a by using an excusive vacuum pump (not shown) for the processing vessel 31a, a part of the silicon bromide is produced on the surface of the wafer W and attached thereto.

Upon completion of the etching process, the gate G2 is opened, and the wafer W is taken out by using the second carrying means 21a. The vacuum in the load lock chamber 22a is then released, and the gate G1 is opened so as to transfer the wafer W processed, from the second carrying means 21a to the first carrying means 13. In this state, the silicon bromide remains on the wafer W. When this matter contacts with the ambient air, it reacts with moisture contained in the air so as to generate a highly corrosive hydrogen bromide gas, and the hydrogen bromide gas will in turn react with ammonia present in a trace amount in the ambient air so as to generate particulate ammonium bromide.

To address such phenomena, the down flow of cleaned air is created due to the FFUs 15a to 15c in the ambient atmospheric carrying chamber 14, as well as the second FFU 60 is provided in the orienter 4 related to the above embodiment, as previously described. Namely, in this example, the stream of cleaned air directed toward the ambient atmospheric carrying chamber 14 is created in the upper chamber 42 of the orienter 4, as well as the internal space of the upper chamber 42 is set at a more positive pressure. Therefore, the corrosive gas and/or particles can be discharged to the outside of the substrate processing apparatus 1 via the exhaust FFU 16 previously described, without causing them to flow into the orienter 4 serving as the functional module.

The first carrying means 13, which has received the wafer W, places it in the corresponding FOUP used for storing processed wafers therein. After the operations describe above have been carried out for all wafers W, the door of the FOUP is closed by using the carrying door 12a to render it able to be carried, as such all of the process to be provided to the wafers W contained in this FOUP is finished.

In the above description for the operation, while only the etching process in the processing vessel 31a has been described, the operation in the case where the process is carried out in the other processing vessel 31b is substantially similar to the case previously described. Namely, in the case where the same process is carried out both in the two processing vessels 31a, 31b, the wafers W are carried such that the processes are performed in these processing vessels 31a, 31b in parallel. Alternatively, in the case where different processes are carried out, in succession, in the two processing vessels 31a, 31b, the wafers W are carried to the respective processing vessels 31a, 31b in a predetermined order such that the processes are performed respectively. In this case, even though matters having potential to generate the corrosive gases as described above are attached to the wafer W in either of the processing vessels 31a, 31b, such matters can be prevented from flowing into the orienter 4, due to the air stream to be created by the second FFU 60.

The following effect can be obtained by the embodiment described above. Namely, since the stream of cleaned air is created, which is directed toward the ambient atmospheric carrying chamber 14 from the functional module (orienter 4), due to the second FFU 60, even though particles and corrosive gases are generated due to contact of the ambient air with the wafer W having been processed in the processing vessel 31a, 31b and carried into the ambient atmospheric carrying chamber 14, these matters can be prevented from flowing into the function module. Thus, corrosion of the functional module due to the corrosive gases can be prevented. Since attachment of the particles to the functional module can also be prevented, bad effect on, for example, an optical system of the functional module can be avoided, thereby eliminating measurement errors. It should be appreciated that the present invention may also be applied to the case in which matters to be generated on the wafer W contact with the ambient air and are then diffused into the ambient air as only one of the corrosive gases and particles.

The functional module including the second FFU 60 is not limited to the one described in the embodiment above. For example, it may be a testing module for testing the substrate surface to grasp a processed state, which is provided in the substrate processing apparatus 1 adapted to perform film forming on the surface of the wafer W by using a CVD process or the like in each processing vessel 31a, 31b. For example, the functional module may have a structure including a film thickness meter 7 adapted to measure a thickness of a film formed on the substrate.

One embodiment including such a functional module will be described in brief. For example, in a case of film forming on the surface of the wafer W by using a CVD process in each processing vessel 31a, 31b of the substrate processing apparatus 1 shown in FIG. 1, the film thickness meter 7 is attached to a side wall of the ambient atmospheric carrying chamber 14 on the opposite side (right side in the drawing) of the orienter 4 (orienter container 41 in FIG. 1).

Figure 7:
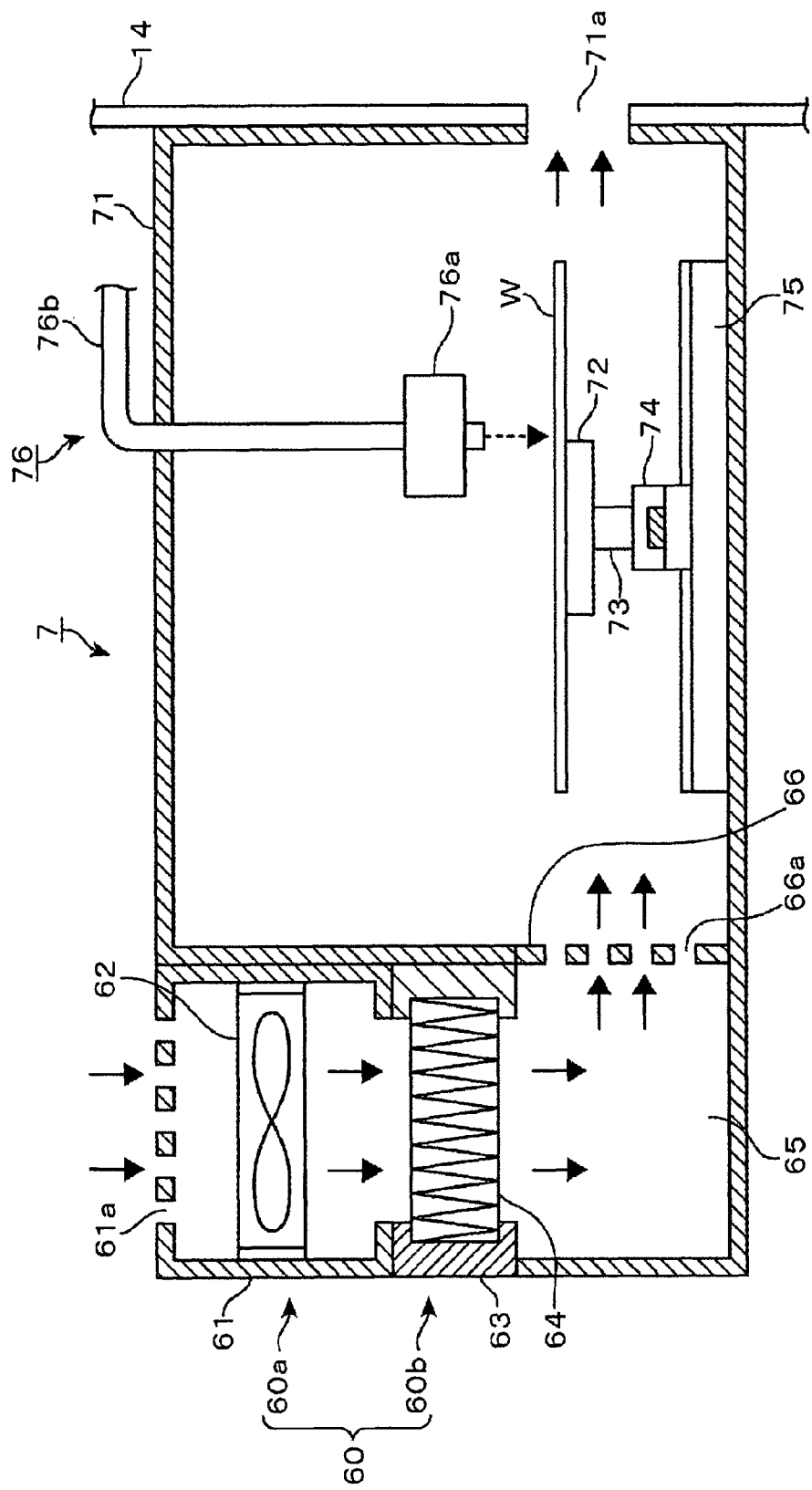
FIG. 7 is a longitudinal cross section showing a structure of a film thickness meter including a fan filter unit, which is another example of the functional module.

The film thickness meter 7, as is schematically shown in a cross section of FIG. 7, includes a film thickness meter container 71 having a transfer port 71a formed in its side wall, a placing table 72 provided in the film thickness meter container 71 and used for placing the wafer W thereon, a shaft 73 adapted to rotate the placing table 72, drive mechanisms 74, 75 respectively adapted to move the placing table 72 in the X direction and the Y direction, and an optical-interference type measurement section 76.

The measurement section 76 includes a probe 76a provided to be opposed to the surface of the wafer W on the placing table 72, an optical fiber 76b, and a spectroscope unit (not shown) including a spectroscope and a controller. The film thickness meter 7 is configured to move the wafer W in both of the X and Y directions so as to locate the probe 76a in multiple positions, for example, along the diameter of the wafer W, measure spectra of reflected light which has been radiated onto the surface of the wafer W, and detect the film thickness based on the spectra.

Further, the film thickness meter 7 includes the second FFU 60 having substantially the same structure as the one previously described with reference to FIG. 5. Namely, an air stream directed toward the ambient atmospheric carrying chamber 14 is created in the film thickness meter container 71, due to cleaned air flowing out from through holes 66a of the current plate 66. Therefore, even in the case where matters having potential to generate corrosive gases or the like are attached to the surface of the wafer W having experienced a film forming process in each processing vessel 31a, 31b, such matters (particles and/or corrosive gases) generated in the ambient atmospheric carrying chamber 14 can be prevented from flowing into the film thickness meter container 71, as well as the matters to be generated in the film thickness meter container 71 can be discharged toward the ambient atmospheric carrying chamber 14, due to the air stream described above.

In the embodiment illustrated, while an example in which the orienter 4 and the film thickness meter 7 are installed at side walls outside the ambient atmospheric carrying chamber 14 has been described, these functional modules each including the second FFU 60 may be located in the ambient atmospheric carrying chamber 14.

The invention claimed is:

1. A substrate processing apparatus, comprising:
   a processing vessel adapted to provide a process to a substrate;
   an ambient atmospheric carrying chamber which is connected airtightly with the processing vessel, includes a carrying means adapted to receive and carry the substrate having been processed in the processing vessel, and is set under an ambient atmosphere;
   a first air stream creating means for creating a stream of cleaned air in the ambient atmospheric carrying chamber;
   a functional module provided in a position for enabling the substrate to be transferred by the carrying means, and adapted to provide a predetermined work to the substrate in the ambient atmosphere; and
   a second air stream creating means for creating a stream of cleaned air directed toward the interior of the ambient atmospheric carrying chamber, by taking in a gas from the exterior of the substrate processing apparatus toward the functional module, wherein
   in the processing vessel, the process for generating products on the substrate is performed to the substrate, the products having potential to be diffused into the ambient air, as particles and/or corrosive gases, due to contact with the ambient air;
   the second air stream creating means is configured such that the interior of the functional module is set under a pressure condition more positive than in the ambient atmospheric carrying chamber to direct the stream of cleaned air in the interior of the functional module toward the interior of the ambient atmospheric carrying chamber; and the work provided to the substrate by the functional module is an alignment for the substrate.

2. The substrate processing apparatus according to claim 1, wherein the second air stream creating means comprises a fan filter unit including a fan and a gas filter.

3. The substrate processing apparatus according to claim 1, wherein the work provided to the substrate by the functional module is carried out by using an optical instrument.

4. The substrate processing apparatus according to claim 1, wherein a silicon halide is generated by the process to be provided to the substrate in the processing vessel.

5. The substrate processing apparatus according to claim 1, wherein the process to be provided to the substrate in the processing vessel is a vacuum process, wherein a load lock chamber is provided between the ambient atmospheric chamber and the processing vessel, and wherein the load lock chamber can be changed between a normal pressure atmospheric mode and a vacuum atmospheric mode.

6. The substrate processing apparatus according to claim 1, wherein the second air stream creating means is provided in the functional module.

* * * * *